(12) United States Patent
Gunji et al.

(10) Patent No.: US 8,432,176 B2
(45) Date of Patent: Apr. 30, 2013

(54) APPARATUS AND METHOD FOR TESTING SEMICONDUCTOR DEVICES

(75) Inventors: Katsuhiro Gunji, Miyazaki (JP); Toru Iwasaki, Miyazaki (JP); Takaaki Sasaki, Tokyo (JP)

(73) Assignee: OKI Semiconductor Co., Ltd., Tokyo (JP)

( * ) Notice: Subject to any disclaimer, the term of this patent is extended or adjusted under 35 U.S.C. 154(b) by 436 days.

(21) Appl. No.: 12/702,347

(22) Filed: Feb. 9, 2010

(65) Prior Publication Data

US 2010/0201391 A1 Aug. 12, 2010

(30) Foreign Application Priority Data

Feb. 12, 2009 (JP) ................................. 2009-029549

(51) Int. Cl.
*G01R 31/00* (2006.01)
(52) U.S. Cl.
USPC ............. 324/750.03; 324/756.03; 324/756.02
(58) Field of Classification Search ............ 324/750.01–750.28, 756.03, 762.02
See application file for complete search history.

(56) References Cited

U.S. PATENT DOCUMENTS

| | | | | |
|---|---|---|---|---|
| 5,124,639 A | * | 6/1992 | Carlin et al. | 324/750.03 |
| 5,521,523 A | * | 5/1996 | Kimura et al. | 324/750.03 |
| 6,580,282 B1 | * | 6/2003 | Lieutard et al. | 324/750.07 |
| 7,091,733 B2 | * | 8/2006 | Takekoshi et al. | 324/750.03 |
| 2003/0155939 A1 | * | 8/2003 | Lutz et al. | 324/760 |
| 2008/0116925 A1 | * | 5/2008 | Sunohara et al. | 324/761 |

FOREIGN PATENT DOCUMENTS

| | | | |
|---|---|---|---|
| JP | 2000-138268 | | 5/2000 |
| JP | 2000-241454 | | 9/2000 |
| JP | 2006162476 A | * | 6/2006 |

* cited by examiner

Primary Examiner — Arleen M Vazquez
(74) Attorney, Agent, or Firm — Volentine & Whitt, PLLC

(57) ABSTRACT

A test apparatus for testing semiconductor integrated circuits includes a test head, a probe card holder for detachably holding a probe card that probes a semiconductor device, a heater for heating the probe card, and a heater holder that holds the heater in direct contact with the probe card when the probe card is held by the probe card holder. The test apparatus heats the probe card efficiently and thereby reduces test time and cost.

15 Claims, 7 Drawing Sheets

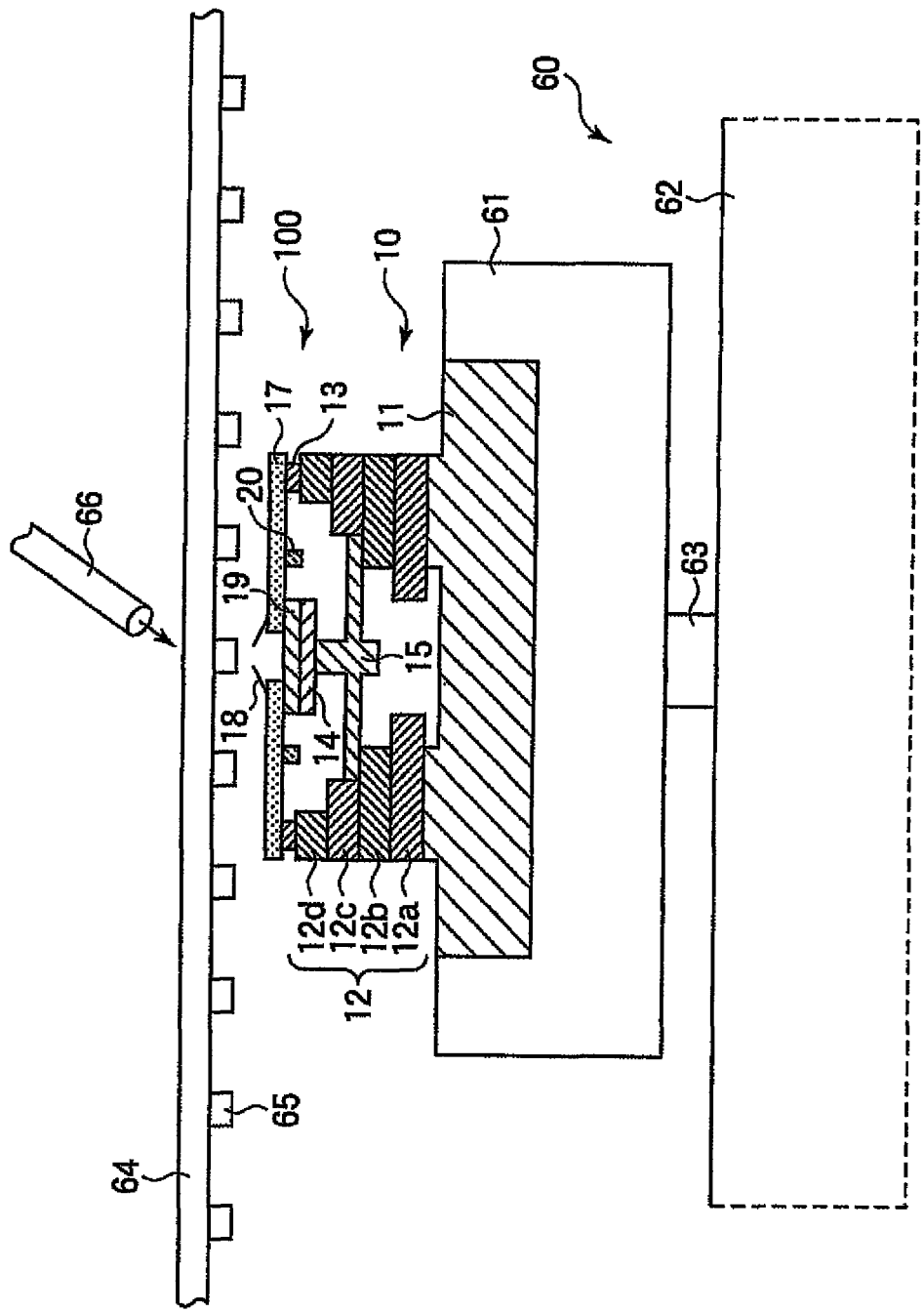

APPARATUS AND METHOD FOR TESTING SEMICONDUCTOR DEVICES

BACKGROUND OF THE INVENTION

1. Field of the Invention

The present invention relates to an apparatus and a method for testing semiconductor integrated circuits at an elevated temperature.

2. Description of the Related Art

In the semiconductor device fabrication process, after a plurality of integrated circuits are formed on a semiconductor wafer, they are tested in the wafer state, before the wafer is diced into individual integrated circuits or 'chips'. Such tests are conventionally carried out by positioning the wafer on the test stage of a wafer prober, contacting the electrode lead pads of the integrated circuits with probe pins disposed on a probe card mounted in the wafer prober, and measuring the electrical characteristics of the integrated circuits. This type of test enables each semiconductor integrated circuit (chip) to be identified as good or bad, so that defective chips can be screened out.

The tests carried out using this type of wafer prober are generally performed at an elevated temperature, such as 100 degrees Celsius or more. It is therefore necessary to heat the semiconductor wafer to the prescribed temperature before the test begins and maintain it at the prescribed temperature during the test. For effective heating, a heater is often incorporated into the chuck that holds the wafer.

High-temperature electrical tests are also carried out on tape-mounted semiconductor integrated circuits, such as chip-on-film (COF) and tape-carrier-package (TCP) semiconductor integrated circuits. These tests are conventionally carried out by a chip handler equipped with a probe card and a hot air blower.

When high-temperature electrical tests are performed as described above, only the semiconductor wafer or only the semiconductor integrated circuits are heated directly. The probe card is separated from the heat source (heater or air blower nozzle) and is heated only indirectly, so its temperature rises more slowly. In the test process using a wafer prober, the probe card is not heated at all when the wafer chuck is moved away from the test stage. One consequent problem is unwanted cooling of the wafer by the probe pins, making it is difficult to test the integrated circuits at the intended temperature, because the test starts with the probe card at a relatively low temperature. Another problem is inadequate thermal expansion of the probe card, making it necessary to readjust the positions of the probe pins, a process that lengthens the test time.

These problems are addressed by Miki et al. in Japanese Patent Application Publication No. 2000-241454 and by Kawazoe in Japanese Patent Application Publication No. 2000-138268. Both publications disclose a heater attached to a reinforcing plate or holder that holds the probe card, to heat the reinforcing plate or holder, thereby heating the probe card. A problem is that the probe card is still heated only indirectly; much of the heat generated by the heater is dissipated by the reinforcing plate or holder, resulting in wasted energy and higher than necessary heating costs.

Another problem is that the heater is conventionally not turned on until the probe card is mounted, so it takes time for the heater itself to reach the necessary temperature, and then takes further time for the necessary amount of heat to begin reaching the probe card through the reinforcing plate or holder. The resulting lengthened test times lead to higher test costs per wafer or per chip.

An alternative solution, proposed by Carlin et al. in U.S. Pat. No. 5,124,639, is to provide a heating element in the probe card itself, but this increases the cost of the probe card, again leading to higher test costs.

SUMMARY OF THE INVENTION

A general object of the invention is to provide a test apparatus and method for testing semiconductor integrated circuits efficiently.

A more specific object is to heat the probe card in the test apparatus efficiently.

The novel test apparatus provided by the invention has a test head and a probe card holder. The probe card holder detachably holds a probe card including a probe pin for making contact with a semiconductor integrated circuit, to test the semiconductor integrated circuit. The test apparatus also includes a heater for heating the probe card and a heater holder secured to the probe card holder. The heater holder holds the heater so that the heater touches the probe card when the probe card is held by the probe card holder.

The novel test method provided by the invention uses the heater to begin heating the probe card holder and its surrounding area before the probe card is mounted. The probe card is then mounted in the probe card holder and heated by direct contact with the heater. A semiconductor device is placed in a measurement position in the test apparatus, heated by another heater, and tested by using the probe card to measure its characteristics.

In the novel test apparatus and method, the probe card is heated efficiently because it is in direct contact with the heater. Test times are shortened because the probe card reaches the necessary temperature quickly, and because the probe card holder and the space surrounding the heater are preheated before the probe card is mounted. These effects are achieved without added cost, because it is not necessary to provide a separate heating element for each probe card. The overall result is a reduction of test costs.

BRIEF DESCRIPTION OF THE DRAWINGS

In the attached drawings:

FIG. 10 is a partial sectional view of a chip handler including the novel test apparatus.

DETAILED DESCRIPTION OF THE INVENTION

Figure 1:
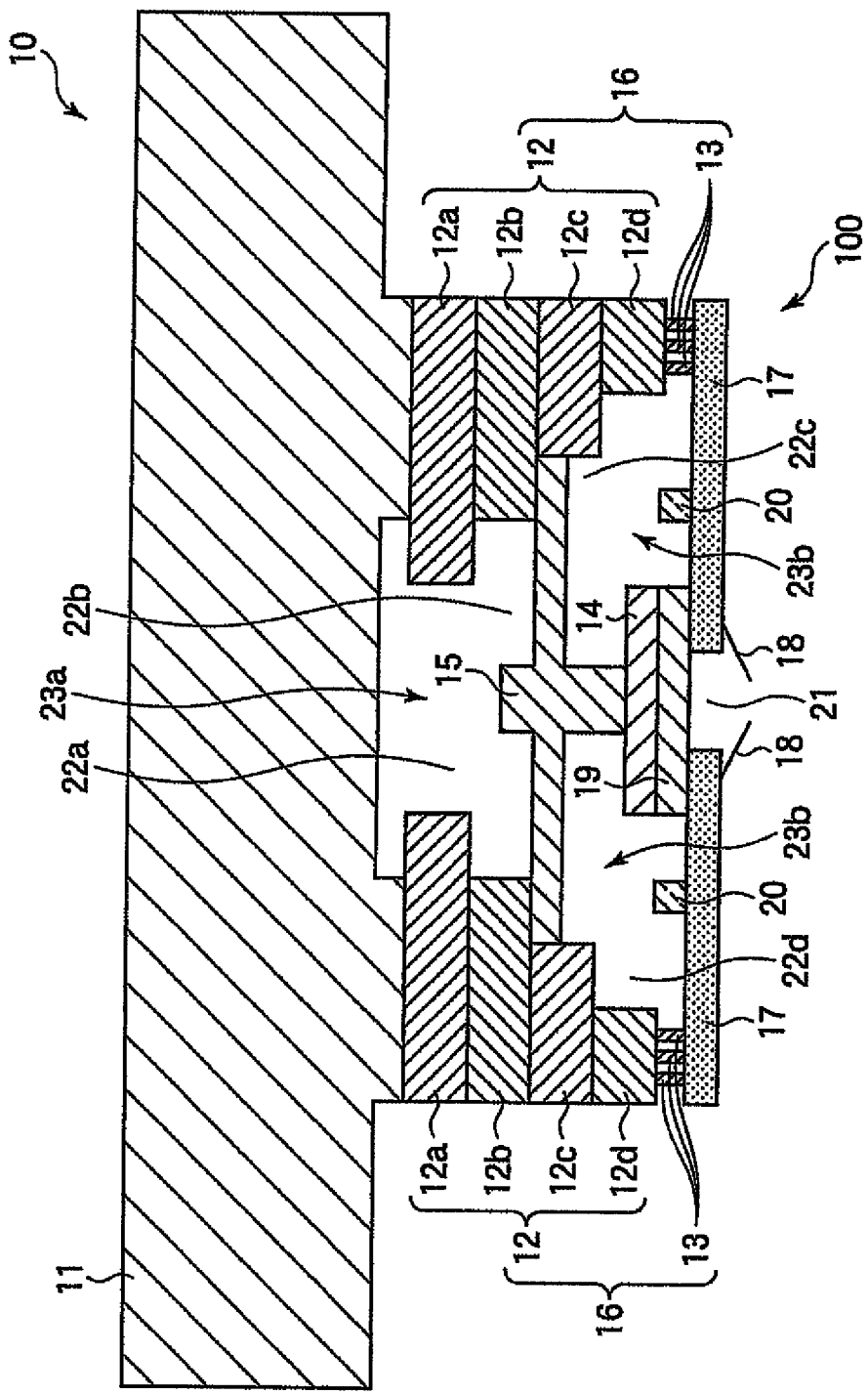
FIG. 1 is a sectional view of a novel test apparatus and a probe card.

Test apparatus and methods embodying the invention will now be described with reference to the attached drawings, in which like elements are indicated by like reference characters.

First Embodiment

Referring to FIG. 1, the test apparatus, referred to below as a tester 10, comprises a test head 11, a connection ring assembly 12 including concentric connection rings 12a to 12d, a plurality of pogo pins 13, a heater 14, and a heater holder 15 for holding the heater 14. The pogo pins 13 detachably connect a probe card 100 to the connection ring assembly 12.

Connection ring 12a is connected to the test head 11 by fasteners such as screws (not shown). All of the connection rings 12a to 12d have screw holes (not shown) and are mutually joined by screws (not shown) screwed into the screw holes. The connection rings 12a to 12d also have substantially circular central apertures 22a to 22d through which part of the test head 11 is exposed. The size of these apertures 22a to 22d increases with increasing distance from the test head 11: connection ring 12a, which is closest to the test head 11, has the smallest aperture 22a; connection ring 12d, which is farthest from the test head 11, has the largest aperture 22d.

The invention is not limited to circular apertures 22a to 22d. The apertures 22a to 22d may be, for example, rectangular or square.

The heater holder 15 is secured to connection ring 12b, on the surface that is in contact with connection ring 12c. The heater holder 15 also meets the inner side wall of connection ring 12c so as to close the aperture 22c of connection ring 12c. Holding the heater 14 is one of the functions of the heater holder 15. Another function of the heater holder 15 is to divide the space comprising the apertures 22a to 22d of the connection rings 12a to 12d at the plane in which connection ring 12b meets connection ring 12c. The space comprising the apertures 22a to 22d is accordingly divided by the heater holder 15 into a space 23a and a space 23b, space 23a being defined by the surface of the test head 11, the surfaces and inner side wall of connection ring 12a, the sides of connection ring 12b, and the upper surface of the heater holder 15, space 23b being defined by the surface and inner side wall of connection ring 12c, the inner side wall of connection ring 12d, and the lower surface of the heater holder 15. The separation of space 23a from space 23b by the heater holder 15 prevents cooling air used to cool the test head 11 from reaching the heater 14, thereby improving the heating efficiency of the heater 14 and reducing the time required for the probe card 100 to reach the temperature necessary for testing.

The pogo pins 13 extend downward from connection ring 12d to make electrical contact with wiring on the upper surface of the substrate 17 of the probe card 100, which is detachably held below the connection ring assembly 12. A reinforcing plate 19 and various electrical components 20 are mounted on this surface of the probe card 100. The substrate 17 has an opening 21 which is covered by the reinforcing plate 19. Probe pins 18 are mounted on the opposite surface (the lower surface) of the substrate 17 of the probe card 100. The probe pins 18 are canted so that their tips are located below the opening 21 in the substrate 17 of the probe card 100.

When the probe card 100 is mounted, its reinforcing plate 19 touches the heater 14. Heat generated in the heater 14 is supplied directly through the reinforcing plate 19 to the substrate 17 and the probe pins 18, so that the probe card 100 is heated quickly. The size of the reinforcing plate 19 is preferably equal to or slightly larger than the size of the heater 14, to prevent the heater 14 from touching the components 20 mounted on the substrate 17. The probe pins 18 are electrically connected to the test head 11 by conductive paths that include the pogo pins 13 and various signal lines and traces (not shown).

Figure 2:
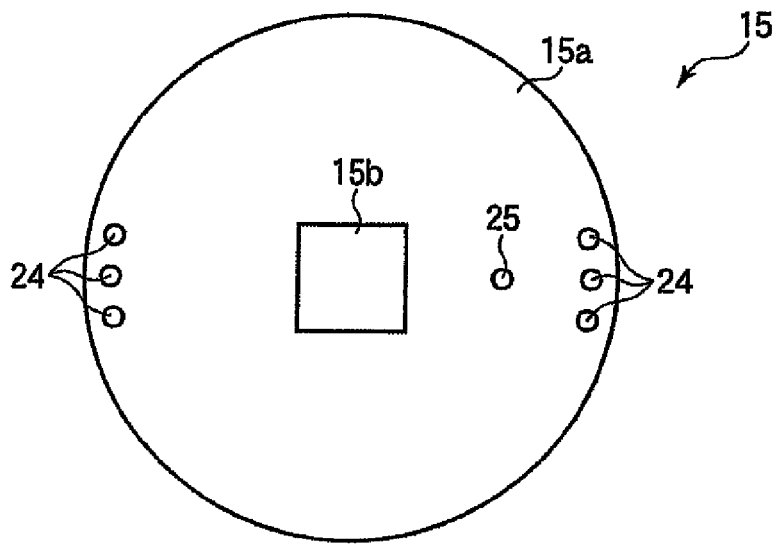
FIGS. 2, 3, and 4 are, respectively, a top plan view, a side view, and a bottom plan view of the heater holder and heater in FIG. 1.
Figure 3:
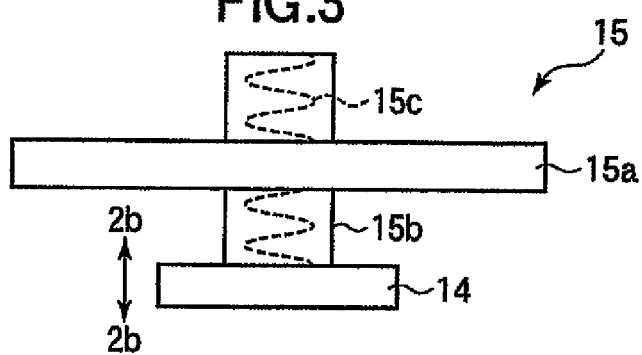

Referring to FIGS. 2 and 3, the heater holder 15 comprises a mounting plate 15a and a shaft 15b. The mounting plate 15a has a shape that fits the aperture 22c of connection ring 12c. In the drawings this shape is a disc shape, but if aperture 22c is square or rectangular, the mounting plate 15a has a matching square or rectangular shape. The shaft 15b fits into a central square aperture in the mounting plate 15a and penetrates through the mounting plate 15a. A plurality of circular openings 24 (in FIG. 2, three each to the left and right of the shaft 15b) are formed near the outer perimeter of the mounting plate 15a. The mounting plate 15a is fastened to connection ring 12b by screws that pass through these openings 24 and are driven into corresponding openings (not shown) in connection ring 12b.

The mounting plate 15a also has an opening 25 for a measurement cable (not shown). The reason for this opening 25 is to shorten the length of the measurement cable, which extends from the test head 11 to the heater 14. From FIGS. 1 to 3 it can readily be seen that a cable of minimum length must pass through the mounting plate 15a. The measurements for which the measurement cable is used include, for example, heater temperature, current, and voltage measurements. When such measurements are not made, the opening 25 is preferably closed by a metal or rubber stopper or the like to prevent cooling air etc. from the space 23a below the test head 11 from leaking into the space 23b around the heater 14.

The shaft 15b has an extensible or telescoping structure and is internally biased by an elastic member 15c such as a spring, indicated by a dotted line in FIG. 3. This structure allows the heater 14 to move, together with the shaft 15b, as indicated by the double-headed arrow 2b in FIG. 3, and prevents the heater 14 and the reinforcing plate 19 of the probe card 100 from being damaged when the heater 14 makes contact with the reinforcing plate 19.

Figure 4:
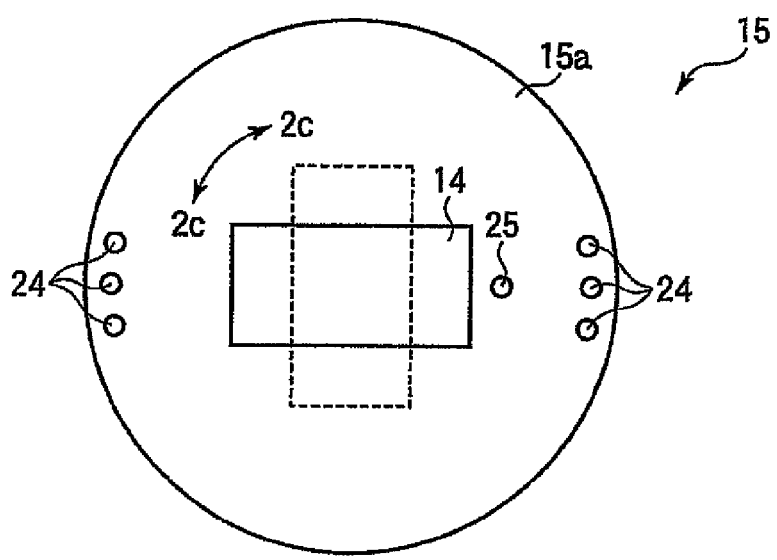

The shaft 15b can also turn the heater 14 as indicated by the double-headed arrow 2c in FIG. 4. This motion is driven by a motor 33, shown in FIG. 5, which is connected directly or indirectly to the shaft 15b. The shaft 15b thus functions as a compressible spindle that holds the heater 14 in a plane parallel to the surface of contact between the heater 14 and probe card 100, but can orient the heater 14 in different directions, such as the two directions indicated by the solid line and the dashed line in FIG. 4, which differ by 90 degrees. The position and orientation of the heater 14 can thus be changed to match the height and orientation of the reinforcing plate 19 on the probe card 100. The capability to change the orientation of the heater 14 allows the present invention to be used with various different types of probe cards 100. The motor 33 that provides this capability may be structured to turn the heater 14 and shaft 15b as a single unit, or to turn the heater 14 alone without turning the shaft 15b itself. If the shaft 15b itself is turned, the shaft 15b may have a round cross-sectional shape instead of the square shape shown in the drawings.

Figure 5:
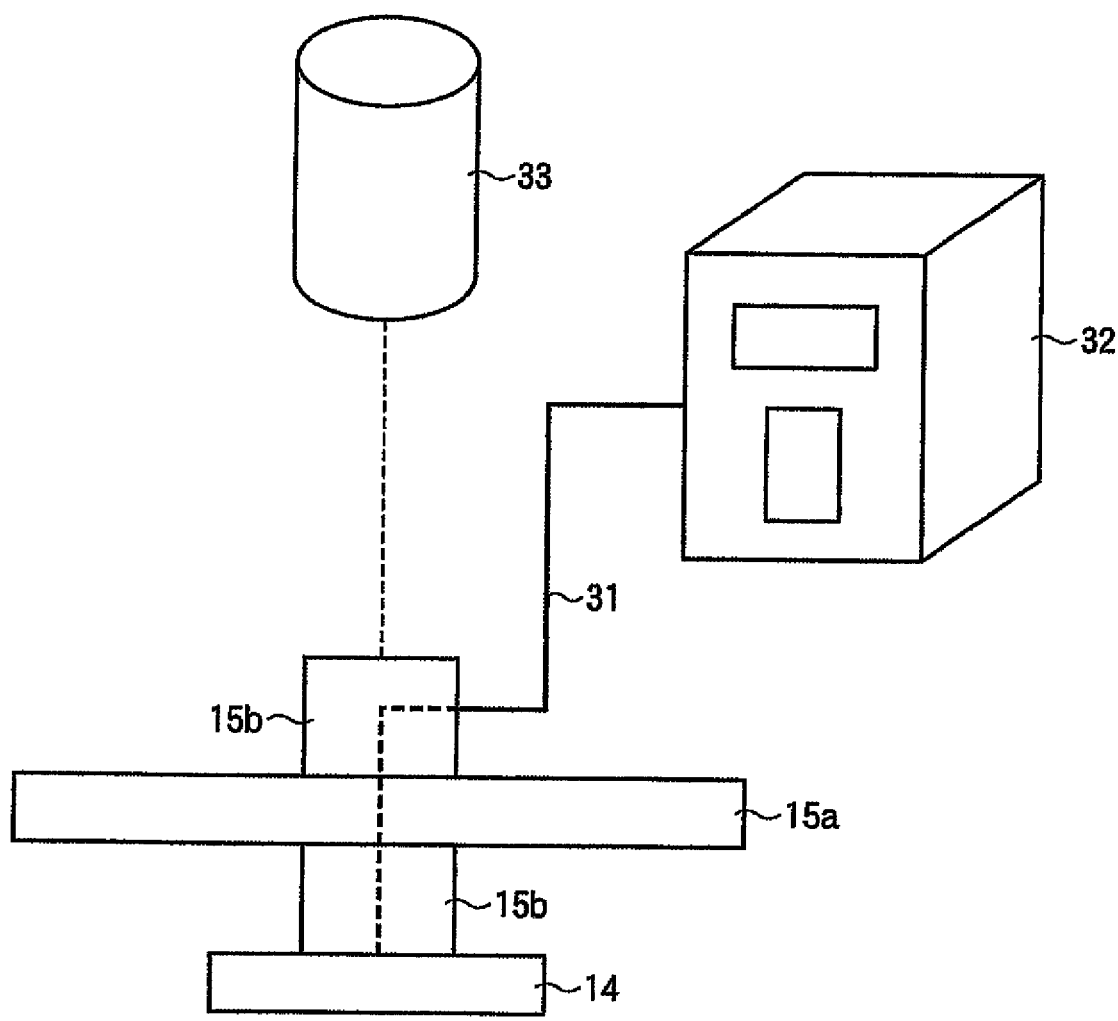
FIG. 5 is a schematic drawing of the heater holder and heater and related components of the novel test apparatus.

As also shown in FIG. 5, the heater 14 is connected by connection wiring 31 to a heater controller 32. The heater 14 includes a sensor (not shown) such as a thermocouple that supplies a temperature signal to the heater controller 32 via the connection wiring 31. The heater controller 32 adjusts the temperature of the heater 14 according to the temperature signal supplied from the sensor to maintain the probe card 100 at a prescribed temperature.

Next, a testing device including the tester 10 will be described with reference to FIG. 6.

Figure 6:
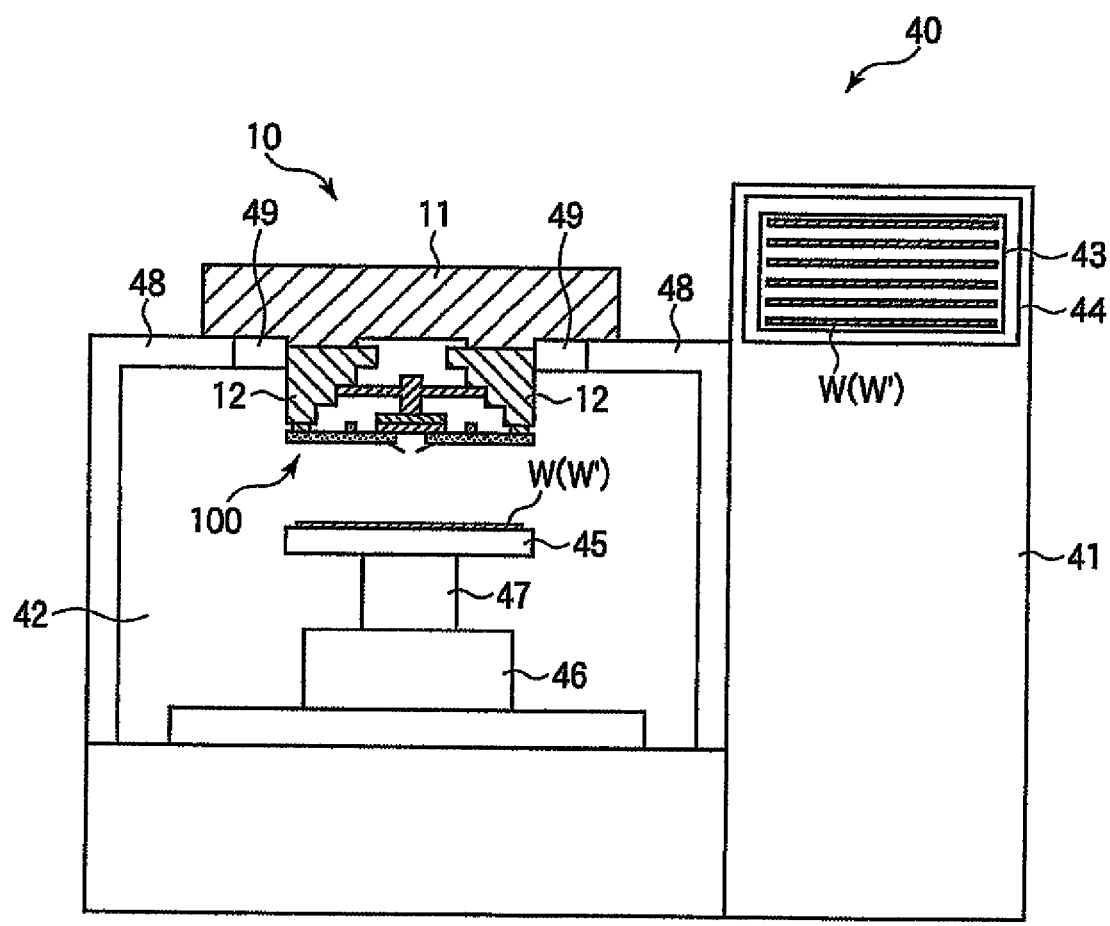
FIG. 6 is a sectional view of a wafer prober including the novel test apparatus.

Referring to FIG. 6, the testing device is a wafer prober 40 comprising a loading chamber 41 for transferring semiconductor wafers W and a probing chamber 42, adjacent to the loading chamber 41, in which the electrical characteristics of the semiconductor wafers W are measured. The semiconductor wafers W are held in a cassette 43. The loading chamber 41 includes a cassette bay 44 in which the cassette 43 is placed and a wafer transfer mechanism (not shown) for transferring wafers one at a time to and from the probing chamber 42. The probing chamber 42 is enclosed by a chamber wall 48 and includes a chuck 45 for holding a semiconductor wafer W, a pedestal 46, a connecting arm 47, a probe card 100, and the novel tester 10. The chuck 45 is mounted on the connecting arm 47, which is supported by pedestal 46; the connecting arm 47 can move the chuck 45 vertically up and down. The connection ring assembly 12 of the tester 10 is held in a ring fixture 49 connected to the chamber wall 48. The test head 11 of the tester 10 is located above the chamber wall 48 and the ring fixture 49, outside the probing chamber 42.

A temperature adjustment mechanism (not shown) such as, for example, a heater and a cooling jacket is incorporated into the chuck 45 to control the temperature of the semiconductor wafer W. The pedestal 46 is movable in the horizontal plane, parallel to the surface of the semiconductor wafer W.

Figure 8:
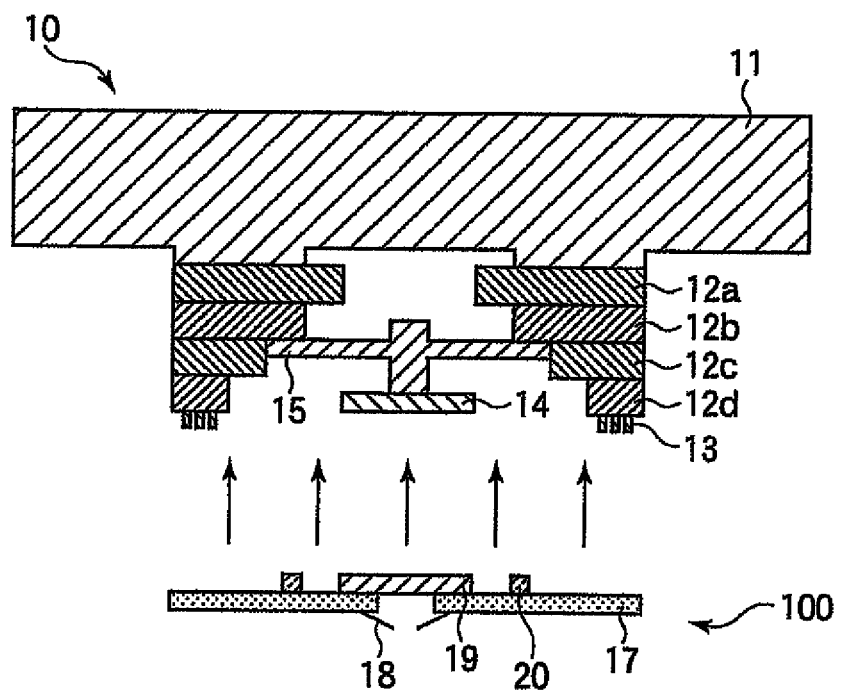
FIG. 8 is a sectional view of the novel test apparatus before the probe card is mounted.
Figure 9:
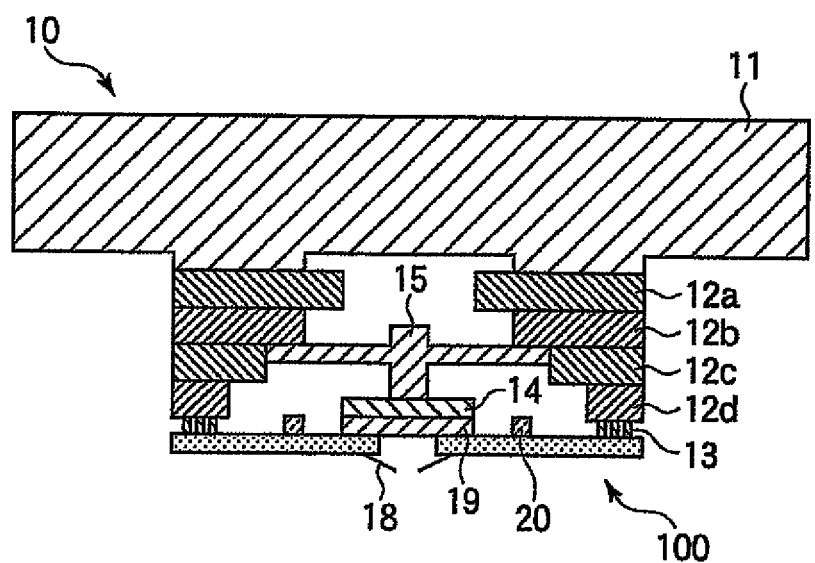
FIG. 9 is a sectional view of the novel test apparatus after the probe is mounted.

Next, a test procedure for testing the electrical characteristics of the semiconductor wafer W by using the wafer prober 40 shown in FIG. 6 will be described with reference to the preceding figures and FIGS. 7 to 9.

Figure 7:
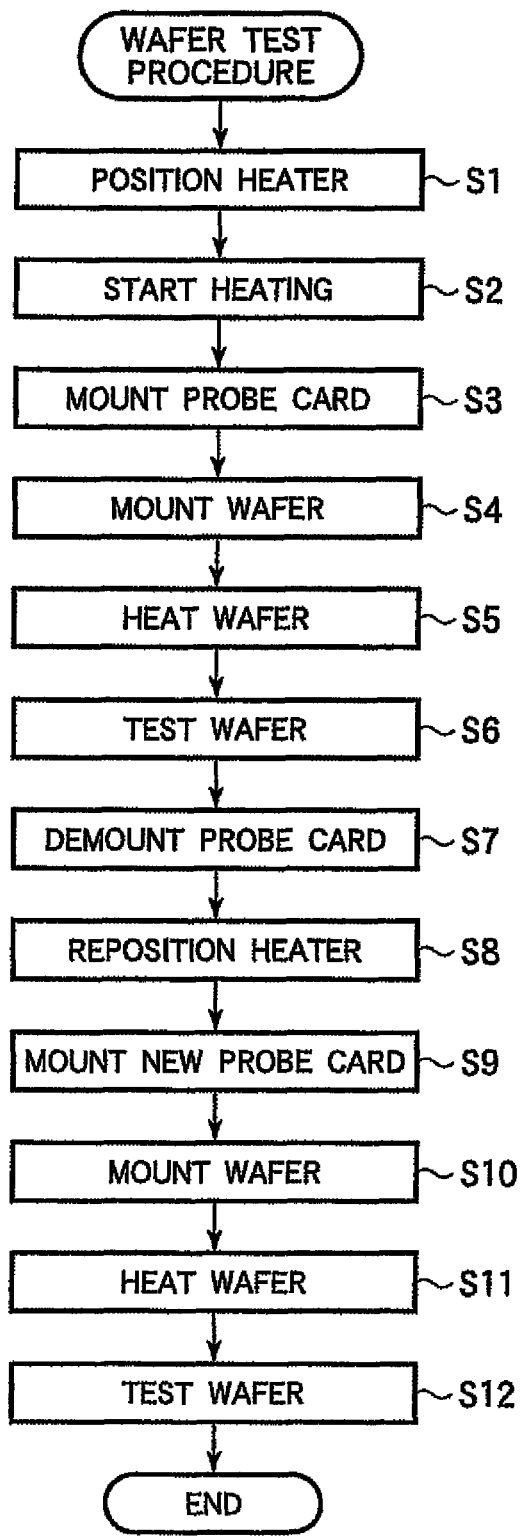
FIG. 7 is a flowchart illustrating a test procedure using the wafer prober in FIG. 6.

First, before the probe card 100 is mounted on the tester 10, the position and orientation of the heater 14 are adjusted so that it will face the reinforcing plate 19 of the probe card 100 (step S1 in FIG. 7). Specifically, the motor 33 in FIG. 5 is driven to rotate the heater 14, or the heater 14 and shaft 15b, thereby adjusting the position and orientation of the heater 14.

Next, the heater 14 is turned on and its temperature begins to rise, heating the surrounding space and the surrounding parts of the probe card holder 16, such as connection rings 12c and 12d and the pogo pins 13 (step S2 in FIG. 7). The probe card 100 is then mounted in the tester 10 so that the reinforcing plate 19 of the probe card 100 faces the heater 14 (step S3). Specifically, the probe card 100 is moved upward as shown in FIG. 8 and mounted on the connection ring assembly 12 so as to make electrical contact with the pogo pins 13 as shown in FIG. 9. At this point, since the heater 14 has already been turned on and has heated the connection ring assembly 12 and the space surrounding the probe card 100, the probe card 100 quickly reaches its prescribed target temperature, which is, for example, about 100° C. Since the heater 14 is aligned with the reinforcing plate 19 of the probe card 100 before the probe card 100 is mounted in the tester 10, realignment of the heater 14 after the probe card 100 is mounted is not required.

Next, a semiconductor wafer W on which a plurality of semiconductor integrated circuits have been formed is mounted in the wafer prober 40 (step S4 in FIG. 7). Normally a plurality of the semiconductor wafers W are loaded into a cassette 43, the cassette 43 is placed in the cassette bay 44 in the loading chamber 41 as shown in FIG. 6, and then one of the semiconductor wafers W is transferred from the cassette 43 into the probing chamber 42 by the wafer transfer mechanism and mounted on the chuck 45.

Next, the semiconductor wafer W is heated by the temperature adjustment mechanism to the temperature necessary for testing, e.g., to a temperature of 100° C. (step S5 in FIG. 7). Since the heating of the probe card 100 began before the heating of the semiconductor wafer W, when the heating of the semiconductor wafer W is completed, the heating of the probe card 100 will also have been completed.

When the heating of the semiconductor wafer W is completed, the semiconductor wafer W and probe card 100 are held at their target temperature or temperatures and a wafer test is carried out by measuring electric characteristics of the semiconductor integrated circuits (not shown) formed on the semiconductor wafer W (step S6 in FIG. 7). During the wafer test, the pedestal 46 is moved horizontally to align the probe card 100 with an integrated circuit or a set of integrated circuits on the semiconductor wafer W; then the connecting arm 47 is driven upward until the external electrode lead pads (not shown) of the semiconductor integrated circuit or circuits make contact with the probe pins 18. Measurement signals supplied from the test head 11 are then applied through the probe pins 18 to the external electrode lead pads on the semiconductor wafer W and the electrical characteristics of the semiconductor integrated circuit or circuits formed on the semiconductor wafer W are measured. At the completion of these measurements, the connecting arm 47 is moved down again and the pedestal 46 is moved horizontally to align the probe card 100 with a different integrated circuit or a different set of integrated circuits on the semiconductor wafer W. This procedure is repeated until all of the integrated circuits on the semiconductor wafer W have been tested; then the semiconductor wafer W is returned from the chuck 45 to the cassette 43 and the remaining semiconductor wafers W in the cassette 43 are tested in the same way.

After the testing of all the semiconductor wafers W in the cassette 43, a new cassette of wafers is placed in the loading chamber 41 for similar testing. If the semiconductor wafers W' in this new cassette are of a different type from the semiconductor wafers W that have just been tested, including, for example, integrated circuits with a different chip size, the probe card 100 is demounted from the tester 10 (step S7 in FIG. 7). The heater 14 is left on and continues to heat the probe card holder 16, including the connection ring assembly 12 and pogo pins 13, and the space 23b adjacent the heater 14.

Next, the orientation of the heater 14 is adjusted to match the orientation of the reinforcing plate 19 of the new probe card that will be used to test the semiconductor wafers W' in the new cassette (step S8 in FIG. 7). Specifically, the motor 33 is driven to rotate the heater 14 as in step S1. The heater 14 remains turned on during this procedure, so the connection ring assembly 12 and surrounding areas inside the tester 10 are maintained at an elevated temperature (e.g., 100° C.).

Next, as in step S3, the new probe card is mounted in the tester 10 so that the reinforcing plate 19 of this probe card and the heater 14 face each other (step S9 in FIG. 7). Since the surrounding parts of the tester 10 are already at an elevated temperature, the temperature of the newly mounted probe card reaches the target test temperature more quickly than in conventional test procedures in which the heater is turned off when the probe card is changed.

After these preparations, the new semiconductor wafers W' are mounted one by one on the chuck 45, heated, and tested (steps S10 to S12). These steps are similar to steps S4 to S6.

In the test procedure described above, since the probe card 100 is heated directly from the heater 14, its temperature can be controlled precisely, which improves the accuracy of the tests. In addition, since the parts of the tester 10 surrounding the probe card 100 are heated before the probe card 100 is mounted, the probe card 100 is brought quickly to the precisely controlled temperature. This is an important factor in reducing test costs by shortening the testing time, especially in a series of tests in which the probe card 100 is changed frequently.

These effects are due to the novel structure of the tester 10, including a test head 11, a probe card holder 16 for detachably holding the probe card 100, a heater 14 for heating the probe card 100, and a heater holder 15 secured to the probe card holder 16 so as to hold the heater 14 in contact with the probe card 100 when the probe card 100 is mounted in the probe card holder 16. Besides making it possible to heat the probe card 100 by direct contact and to heat the probe card holder 16 and the space in which the probe card 100 will be mounted before the probe card 100 is actually mounted, this structure also makes it possible to heat the probe card 100 effectively and bring the probe card 100 to the necessary temperature quickly without having to provide a separate heater 14 for each probe card 100. The novel testing apparatus is therefore less expensive than apparatus that requires a heating element to be built into each probe card.

A further effect is that by confining heat to the space around the probe card 100 and preventing the intrusion of cool air into this space from the space around the wafer, the mounting plate 15a enables the probe card 100 to be heated to and maintained at the necessary temperature with less expenditure of energy, which also translates into reduced test cost.

In a variation of the first embodiment, the probe card 100 has no reinforcing plate 19 and the heater holder 15 holds the heater 14 directly against the substrate 17 of the probe card 100. The same effects as described above are obtained.

Second Embodiment

In the second embodiment, the novel tester 10 is mounted in a chip handler instead of a prober. The chip handler is used for testing the electrical characteristics of tape-mounted semiconductor integrated circuits, such as chip-on-film (COF) and tape-carrier-package (TCP) semiconductor integrated circuit devices.

Referring to FIG. 10, the tester 10 is attached to a tester holder 61 of the chip handler 60. The tester holder 61 is connected through a connecting arm 63 to the base unit 62 of the chip handler 60. The connecting arm 63 can be driven vertically up and down to move the tester 10 and the tester holder 61 toward and away from the semiconductor integrated circuit to be tested. The probe card 100 is mounted in the tester 10 as described in the first embodiment, except that the vertical orientation of the tester 10 and probe card 100 is opposite to the orientation in the first embodiment. The probe card 100 is now mounted on top of the tester 10 and its probe pins 18 are canted upward.

Semiconductor integrated circuits 65 mounted on a tape 64 are positioned above the tester 10 and probe card 100. The tape 64 is wound on a pair of reels (not shown) to which the two ends of the tape 64 are connected. As the tape 64 is wound from one reel to the other reel (the take-up reel), the connecting arm 63 moves up and down repeatedly to bring the probe pins 18 into contact with the external electrode lead pads (not shown) of different semiconductor integrated circuits 65, which are tested substantially as described in the first embodiment. At the completion of the test, the tape 64 is completely wound onto the take-up reel.

When a semiconductor integrated circuit chip 65 mounted on the tape 64 reaches the position where it makes contact with the probe pins 18, it is heated by hot air discharged from an air blower nozzle 66. The air blower nozzle 66 is positioned, for example, above the probe card 100 and heats the semiconductor integrated circuit chip 65 by blowing hot air onto the tape 64, as indicated by the arrow in FIG. 10.

Except for being carried out on tape-mounted semiconductor integrated circuits 65 instead of wafers, and except for the manner in which the semiconductor integrated circuits 65 are transported and heated, the test procedure in the second embodiment is the same as in the first embodiment. A detailed description will be omitted.

In a variation of the second embodiment, the tape 64 is positioned below the tester 10 and the tester 10 and probe card 100 are oriented as in the first embodiment.

The second embodiment has the same effect for tests of tape-mounted chips as the first embodiment has for wafer tests. Because the probe card 100 is heated by direct contact with the heater 14, its temperature can be controlled precisely, so the accuracy of the tests is improved. In addition, since the space surrounding the mounting position of the probe card 100 can be heated by the heater 14 before the probe card 100 is mounted, the probe card 100 can reach its target temperature quickly, and the time required for testing the semiconductor integrated circuit chips 65 can be reduced. The improved heating efficiency and reduced heating time lead to a reduction of test costs.

A few variations of the preceding embodiments have been mentioned above, but those skilled in the art will recognize that further variations are possible within the scope of the invention, which is defined in the appended claims.

What is claimed is:

1. A test apparatus having a test head and a probe card holder detachably holding a probe card including a probe pin for contacting a semiconductor integrated circuit to test the semiconductor integrated circuit, the test apparatus comprising:
   a heater for heating the probe card; and
   a heater holder secured to the probe card holder, for holding the heater so that the heater touches the probe card when the probe card is held by the probe card holder,
   wherein the probe card holder has an aperture exposing the test head and the heater holder fits into and thereby closes the aperture.

2. The test apparatus of claim 1, wherein the probe card holder comprises a plurality of concentric rings and the heater holder is secured to one of the concentric rings.

3. The test apparatus of claim 1, wherein the heater holder includes an aperture for a signal cable extending from the test head to the heater.

4. The test apparatus of claim 1, wherein the heater holder includes an elastic member for moving the heater perpendicular to a plane parallel to a surface of contact between the heater and the probe card.

5. The test apparatus of claim 4, wherein the elastic member is a spring.

6. The test apparatus of claim 4, wherein the heater holder further includes an extensible shaft biased by the elastic member, the heater being held on the extensible shaft.

7. The test apparatus of claim 6, further comprising a motor for turning the extensible shaft to turn the heater in the plane parallel to the surface of contact between the heater and the probe card.

8. The test apparatus of claim 4, further comprising a motor for turning the heater in the plane parallel to the surface of contact between the heater and the probe card.

9. A semiconductor device test method comprising:
   fitting a heater holder mounted in a test apparatus into an aperture exposing a test head mounted on the test apparatus and thereby closing the aperture;
   using a heater held by the heater holder to begin heating a probe card holder secured to the test head and to begin heating a space adjacent the probe card holder;
   mounting a first probe card in the probe card holder so that the first probe card makes direct contact with the heater;
   using the heater to heat the first probe card mounted in the probe card holder;
   placing a first semiconductor device in a measurement position in the test apparatus;

heating the first semiconductor device; and testing the first semiconductor device by using the first probe card to measure characteristics of the first semiconductor device.

10. The semiconductor device test method of claim 9, wherein the first probe card has a reinforcing plate that makes direct contact with the heater.

11. The semiconductor device test method of claim 9, wherein the first probe card has a substrate that makes direct contact with the heater.

12. The semiconductor device test method of claim 9, further comprising adjusting an orientation of the heater before the mounting of the first probe card.

13. The semiconductor device test method of claim 9, further comprising;

measuring a temperature of the heater; and adjusting the temperature of the heater to a prescribed target temperature.

14. A semiconductor device test method comprising:

using a heater mounted in a test apparatus to begin heating a probe card holder secured to a test head mounted on the test apparatus and to begin heating a space adjacent the probe card holder;

mounting a first probe card in the probe card holder so that the first probe card makes direct contact with the heater;

using the heater to heat the first probe card mounted in the probe card holder;

placing a first semiconductor device in a measurement position in the test apparatus;

heating the first semiconductor device;

testing the first semiconductor device by using the first probe card to measure characteristics of the first semiconductor device;

removing the first semiconductor device from the measurement position;

replacing the first probe card with a second probe card by removing the first probe card from the probe card holder and mounting the second probe card in the probe card holder, while using the heater to continue heating the probe card holder and the space adjacent the probe card holder;

placing a second semiconductor device in the measurement position;

heating the second semiconductor device; and testing the second semiconductor device by using the second probe card to measure characteristics of the second semiconductor device.

15. The semiconductor device test method of claim 14, further comprising adjusting an orientation of the heater after removing the first probe card but before mounting the second probe card.

\* \* \* \* \*